United States Patent
Fang et al.

(10) Patent No.: US 7,391,647 B2
(45) Date of Patent: Jun. 24, 2008

(54) NON-VOLATILE MEMORY IN CMOS LOGIC PROCESS AND METHOD OF OPERATION THEREOF

(75) Inventors: Gang-feng Fang, Alameda, CA (US); Dennis Sinitsky, Los Gatos, CA (US); Wingyu Leung, Cupertino, CA (US)

(73) Assignee: Mosys, Inc., Sunnyvale, CA (US)

( * ) Notice: Subject to any disclaimer, the term of this patent is extended or adjusted under 35 U.S.C. 154(b) by 0 days.

(21) Appl. No.: 11/279,382

(22) Filed: Apr. 11, 2006

(65) Prior Publication Data

US 2007/0247914 A1  Oct. 25, 2007

(51) Int. Cl.
*G11C 16/04* (2006.01)

(52) U.S. Cl. ............... 365/185.18; 365/185.24; 365/185.28

(58) Field of Classification Search ............ 365/185.18, 365/185.23, 185.24, 185.28, 185.29
See application file for complete search history.

(56) References Cited

U.S. PATENT DOCUMENTS

| | | | |
|---|---|---|---|
| 6,166,954 A | 12/2000 | Chern | |
| 6,191,980 B1 * | 2/2001 | Kelley et al. ............ | 365/185.29 |
| 6,614,684 B1 | 9/2003 | Shukuri et al. | |
| 6,631,087 B2 | 10/2003 | Di Pede et al. | |
| 6,788,574 B1 | 9/2004 | Han et al. | |
| 7,177,182 B2 * | 2/2007 | Diorio et al. ........... | 365/185.01 |

OTHER PUBLICATIONS

Shi et al. "Polarity Dependent Gate Tunneling Currents in Dual-Gate CMOSFET's", IEEE Transactions on Electron Devices, vol. 45, No. 11, Nov. 1998, pp. 2355-2360.
Ohsaki et al. "A Single Poly EEPROM Cell Structure for Use in Standard CMOS Processes", IEEE Journal of Solid-State Circuits, vol. 29, No. 3, Mar. 1994, pp. 311-316.

* cited by examiner

*Primary Examiner*—Gene N. Auduong
(74) *Attorney, Agent, or Firm*—Bever, Hoffman & Harms, LLP; E. Eric Hoffman

(57) ABSTRACT

A non-volatile memory (NVM) cell fabricated on a semiconductor substrate, and including a floating gate electrode (which extends at least partially over all active regions of the NVM cell). The NVM cell also includes a PMOS access transistor located in a first n-type region, a PMOS control capacitor located in a second n-type region (separate from the first n-type region), and an NMOS programming transistor located in a p-type region. The floating gate electrode is a continuous electrode which extends over the active regions of the PMOS access transistor, the PMOS control capacitor and the NMOS programming transistor. Various array connections are provided for implementing arrays using this NVM cell. The PMOS access transistor and NMOS programming transistor can be replaced with an NMOS access transistor and a PMOS erase transistor, respectively, in an alternate embodiment.

22 Claims, 18 Drawing Sheets

| PROGRAM MODE (PROGRAM CELL 200) | |
|---|---|
| TERMINAL | APPLIED VOLTAGE |
| WL0 | 10 VOLTS |
| WL1 | 5 VOLTS |
| BL0 | 5 VOLTS |
| BL0' | 5 VOLTS |
| BL1 | 5 VOLTS |
| BL1' | 5 VOLTS |
| P0 | 0 VOLTS |
| P1 | 5 VOLTS |
| WLNW0 | 10 VOLTS |
| WLNW1 | 10 VOLTS |
| BLNW0 | 5 VOLTS |
| BLNW1 | 5 VOLTS |
| P-SUB | 0 VOLTS |

FIG. 4A

| ERASE MODE (ERASE CELL 200) | |
|---|---|
| TERMINAL | APPLIED VOLTAGE |
| WL0 | 0 VOLTS |
| WL1 | 5 VOLTS |
| BL0 | 10 VOLTS |
| BL0' | 10 VOLTS |
| BL1 | 0 VOLTS |
| BL1' | 0 VOLTS |
| P0 | 0 VOLTS |
| P1 | 0 VOLTS |
| WLNW0 | 0 VOLTS |
| WLNW1 | 5 VOLTS |
| BLNW0 | 10 VOLTS |
| BLNW1 | 0 VOLTS |
| P-SUB | 0 VOLTS |

FIG. 4B

| READ MODE (READ CELLS 200 & 300) ||
|---|---|
| TERMINAL | APPLIED VOLTAGE |
| WL0 | -1 VOLTS |
| WL1 | 0 VOLTS |
| BL0 | 0.5 VOLTS |
| BL0' | 0 VOLTS |
| BL1 | 0.5 VOLTS |
| BL1' | 0 VOLTS |
| P0 | 0 VOLTS |
| P1 | 0 VOLTS |
| WLNW0 | 0 VOLTS |
| WLNW1 | 0 VOLTS |
| BLNW0 | 0.5 VOLTS |
| BLNW1 | 0.5 VOLTS |
| P-SUB | 0 VOLTS |

| PROGRAM MODE (PROGRAM CELL 200) | |
|---|---|
| TERMINAL | APPLIED VOLTAGE |
| WL0 | 10 VOLTS |
| WL1 | 0 VOLTS |
| BL0 | 5 VOLTS |
| BL0' | 5 VOLTS |
| BL1 | 5 VOLTS |
| BL1' | 5 VOLTS |
| P0 | 0 VOLTS |
| P1 | 5 VOLTS |
| WLNW0 | 10 VOLTS |
| WLNW1 | 0 VOLTS |
| BLNW0 | 5 VOLTS |
| BLNW1 | 5 VOLTS |
| P-SUB | 0 VOLTS |

FIG. 6A

| ERASE MODE (ERASE ALL CELLS) | |
|---|---|
| TERMINAL | APPLIED VOLTAGE |
| WL0 | 0 VOLTS |
| WL1 | 0 VOLTS |
| BL0 | 10 VOLTS |
| BL0' | 10 VOLTS |
| BL1 | 10 VOLTS |
| BL1' | 10 VOLTS |
| P0 | 0 VOLTS |
| P1 | 0 VOLTS |
| WLNW0 | 0 VOLTS |
| WLNW1 | 0 VOLTS |
| BLNW0 | 10 VOLTS |
| BLNW1 | 10 VOLTS |
| P-SUB | 0 VOLTS |

FIG. 6B

| PROGRAM MODE (ALL CELLS) | |
|---|---|
| TERMINAL | APPLIED VOLTAGE |
| WL0 | 10 VOLTS |
| WL1 | 10 VOLTS |
| BL0 | 10 VOLTS |
| BL0' | 10 VOLTS |
| BL1 | 10 VOLTS |
| BL1' | 10 VOLTS |
| P0 | 0 VOLTS |
| P1 | 0 VOLTS |
| WLNW0 | 10 VOLTS |
| WLNW1 | 10 VOLTS |
| BLNW0 | 10 VOLTS |
| BLNW1 | 10 VOLTS |
| P-SUB | 0 VOLTS |

| PROGRAM MODE (PROGRAM CELL 200) | |
|---|---|
| TERMINAL | APPLIED VOLTAGE |
| WL0 | 10 VOLTS |
| WL1 | 5 VOLTS |
| BL0 | 0 VOLTS |
| BL0' | 0 VOLTS |
| BL1 | 5 VOLTS |
| BL1' | 5 VOLTS |
| E0 | 5 VOLTS |
| E1 | 5 VOLTS |
| WLNW0 | 10 VOLTS |
| WLNW1 | 10 VOLTS |
| ENW0 | 5 VOLTS |
| ENW1 | 5 VOLTS |
| P-SUB | 0 VOLTS |

FIG. 10A

| ERASE MODE (ERASE CELL 200) | |
|---|---|
| TERMINAL | APPLIED VOLTAGE |
| WL0 | 0 VOLTS |
| WL1 | 5 VOLTS |
| BL0 | 0 VOLTS |
| BL0' | 0 VOLTS |
| BL1 | 0 VOLTS |
| BL1' | 0 VOLTS |
| E0 | 10 VOLTS |
| E1 | 0 VOLTS |
| WLNW0 | 5 VOLTS |
| WLNW1 | 5 VOLTS |
| ENW0 | 10 VOLTS |
| ENW1 | 0 VOLTS |
| P-SUB | 0 VOLTS |

FIG. 10B

| READ MODE (READ CELLS 200 & 300) ||
|---|---|
| TERMINAL | APPLIED VOLTAGE |
| WL0 | 1 VOLTS |
| WL1 | 0 VOLTS |
| BL0 | 0.5 VOLTS |
| BL0' | 0 VOLTS |
| BL1 | 0.5 VOLTS |
| BL1' | 0 VOLTS |
| E0 | 0 VOLTS |
| E1 | 0 VOLTS |
| WLNW0 | 1 VOLTS |
| WLNW1 | 1 VOLTS |
| ENW0 | 0 VOLTS |
| ENW1 | 0 VOLTS |
| P-SUB | 0 VOLTS |

FIG. 10C

| PROGRAM MODE (PROGRAM ALL CELLS) | |
|---|---|
| TERMINAL | APPLIED VOLTAGE |
| WL0 | 10 VOLTS |
| WL1 | 10 VOLTS |
| BL0 | 0 VOLTS |
| BL0' | 0 VOLTS |
| BL1 | 0 VOLTS |
| BL1' | 0 VOLTS |
| E0 | 10 VOLTS |
| E1 | 10 VOLTS |
| WLNW0 | 10 VOLTS |
| WLNW1 | 10 VOLTS |
| ENW0 | 10 VOLTS |
| ENW1 | 10 VOLTS |
| P-SUB | 0 VOLTS |

FIG. 12A

| ERASE MODE (ERASE CELL 200) | |
|---|---|
| TERMINAL | APPLIED VOLTAGE |
| WL0 | 0 VOLTS |
| WL1 | 5 VOLTS |
| BL0 | 0 VOLTS |
| BL0' | 0 VOLTS |
| BL1 | 0 VOLTS |
| BL1' | 0 VOLTS |
| E0 | 10 VOLTS |
| E1 | 5 VOLTS |
| WLNW0 | 0 VOLTS |
| WLNW1 | 5 VOLTS |
| ENW0 | 10 VOLTS |
| ENW1 | 5 VOLTS |
| P-SUB | 0 VOLTS |

FIG. 12B

| PROGRAM MODE (PROGRAM CELL 200) ,1401 | |
|---|---|
| TERMINAL | APPLIED VOLTAGE |
| WL0 | 10 VOLTS |
| WL1 | 0 VOLTS |
| BL0 | 0 VOLTS |
| BL0' | 0 VOLTS |
| BL1 | 5 VOLTS |
| BL1' | 5 VOLTS |
| E0 | 5 VOLTS |
| E1 | 0 VOLTS |
| WLNW0 | 10 VOLTS |
| WLNW1 | 0 VOLTS |
| ENW0 | 5 VOLTS |
| ENW1 | 0 VOLTS |
| P-SUB | 0 VOLTS |

FIG. 14A

| ERASE MODE (ERASE ALL CELLS) ,1402 | |
|---|---|
| TERMINAL | APPLIED VOLTAGE |
| WL0 | 0 VOLTS |
| WL1 | 0 VOLTS |
| BL0 | 0 VOLTS |
| BL0' | 0 VOLTS |
| BL1 | 0 VOLTS |
| BL1' | 0 VOLTS |
| E0 | 10 VOLTS |
| E1 | 10 VOLTS |
| WLNW0 | 0 VOLTS |
| WLNW1 | 0 VOLTS |
| ENW0 | 10 VOLTS |
| ENW1 | 10 VOLTS |
| P-SUB | 0 VOLTS |

FIG. 14B

NON-VOLATILE MEMORY IN CMOS LOGIC PROCESS AND METHOD OF OPERATION THEREOF

FIELD OF THE INVENTION

The present invention relates to non-volatile memory (NVM). More particularly, this invention relates to non-volatile memory cells fabricated using an application specific integrated circuit (ASIC) process or a conventional logic process. In the present application, a conventional logic process is defined as a semiconductor process that implements single-well, twin-well or triple-well technology, and which includes a single layer of conductive gate material. The present invention further relates to a method of operating a non-volatile memory utilizing Fowler-Nordheim tunneling for both erase and program operations.

BACKGROUND OF INVENTION

For system-on-chip (SOC) applications, it is desirable to integrate many functional blocks into a single integrated circuit. The most commonly used blocks include a microprocessor or micro-controller, static random access memory (SRAM) blocks, non-volatile memory blocks, and various special function logic blocks. However, traditional non-volatile memory processes, which typically use stacked gate or split-gate memory cells, are not compatible with a conventional logic process.

The combination of a non-volatile memory (NVM) process and a conventional logic process results in a much more complicated and expensive "merged non-volatile memory and logic" process to implement system-on-chip integrated circuits. This is undesirable, because the typical usage of the non-volatile memory block in an SOC application is small in relation to the overall chip size.

SUMMARY

Accordingly, the present invention provides a non-volatile memory cell that can be fabricated using a conventional logic process without any process step modifications. These non-volatile memory cells use a gate dielectric layer typically used in input/output (I/O) devices of an integrated circuit. For example, this gate dielectric layer can have a thickness in the range of about 4 nm to 7 nm, (while logic transistors fabricated on the same integrated circuit have a gate dielectric thickness in the range of 1.5 to 2.2 nm). The non-volatile memory cells can be programmed and erased using relatively low voltages compared to conventional non-volatile memory cells. The voltages required to program and erase can be provided by transistors readily available in a conventional logic process (i.e., transistors having a transistor avalanche breakdown voltage in the range of 5 Volts to 7 Volts). The non-volatile memory is programmed and erased by Fowler-Nordheim tunneling within the channel regions of the non-volatile memory cells. Electrons tunnel from an N-channel inversion layer to a floating gate node. Electrons also tunnel from the floating gate node to a PMOS channel inversion layer.

In one embodiment, the non-volatile memory cell includes a PMOS access transistor located in a first n-type region, a PMOS control capacitor located in a second n-type region (separate from the first n-type region), and an NMOS programming transistor located in a p-type region. A continuous floating gate electrode extends over the active regions of the PMOS access transistor, the PMOS control capacitor and the NMOS programming transistor. Various array connections are provided for implementing arrays using this NVM cell.

In an alternate embodiment, the PMOS access transistor and the NMOS programming transistor are replaced with an NMOS access transistor and a PMOS erase transistor, respectively. Various array connections are also provided for implementing arrays using this NVM cell.

The present invention will be more fully understood in view of the following description and drawings.

BRIEF DESCRIPTION OF THE DRAWINGS

FIGS. 4A, 4B and 4C are tables that define programming, erase and read operations, respectively, of the array of FIG. 3, in accordance with one embodiment of the present invention.

FIGS. 6A and 6B are tables that define programming and erase operations, respectively, of the array of FIG. 5, in accordance with one embodiment of the present invention.

FIG. 8A is a table defining a programming operation of the array of FIG. 7, in accordance with one embodiment of the present invention.

FIGS. 10A, 10B and 10C are tables that define programming, erase and read operations, respectively, of the array of FIG. 9, in accordance with one embodiment of the present invention.

FIGS. 12A and 12B are tables that define programming and erase operations, respectively, of the array of FIG. 11, in accordance with one embodiment of the present invention.

FIGS. 14A and 14B are tables that define program and erase operations, respectively, of the array of FIG. 13 in accordance with one embodiment of the present invention.

DETAILED DESCRIPTION

Note the general nature of the present invention is in no manner limited by the specific values used in the descriptions and drawings. For example, it is assumed that 5 Volts is less than what is commonly known in industry as junction-to-well breakdown voltage. A voltage of magnitude close to 5 Volts applied across the gate dielectric layer of a device in the described embodiments does not introduce significant tunneling current through this gate dielectric layer. However, a voltage of magnitude close to 10 Volts applied across the gate dielectric layer of a device in the described embodiments does introduce significant tunneling current through this gate dielectric layer. Moreover, a voltage of magnitude close to 10 Volts is less than what is commonly known in industry as well-to-well breakdown voltage, due to lower concentration of well dopants. In the embodiments described below, particular numbers are used to denote the voltages applied to different terminals of various non-volatile memory cells. It is understood that those voltages need not be exact while used across drawings and embodiments, and need not be exact while used in the same drawing and embodiment; these voltages only convey the general concept of the biasing schemes.

Figure 1:
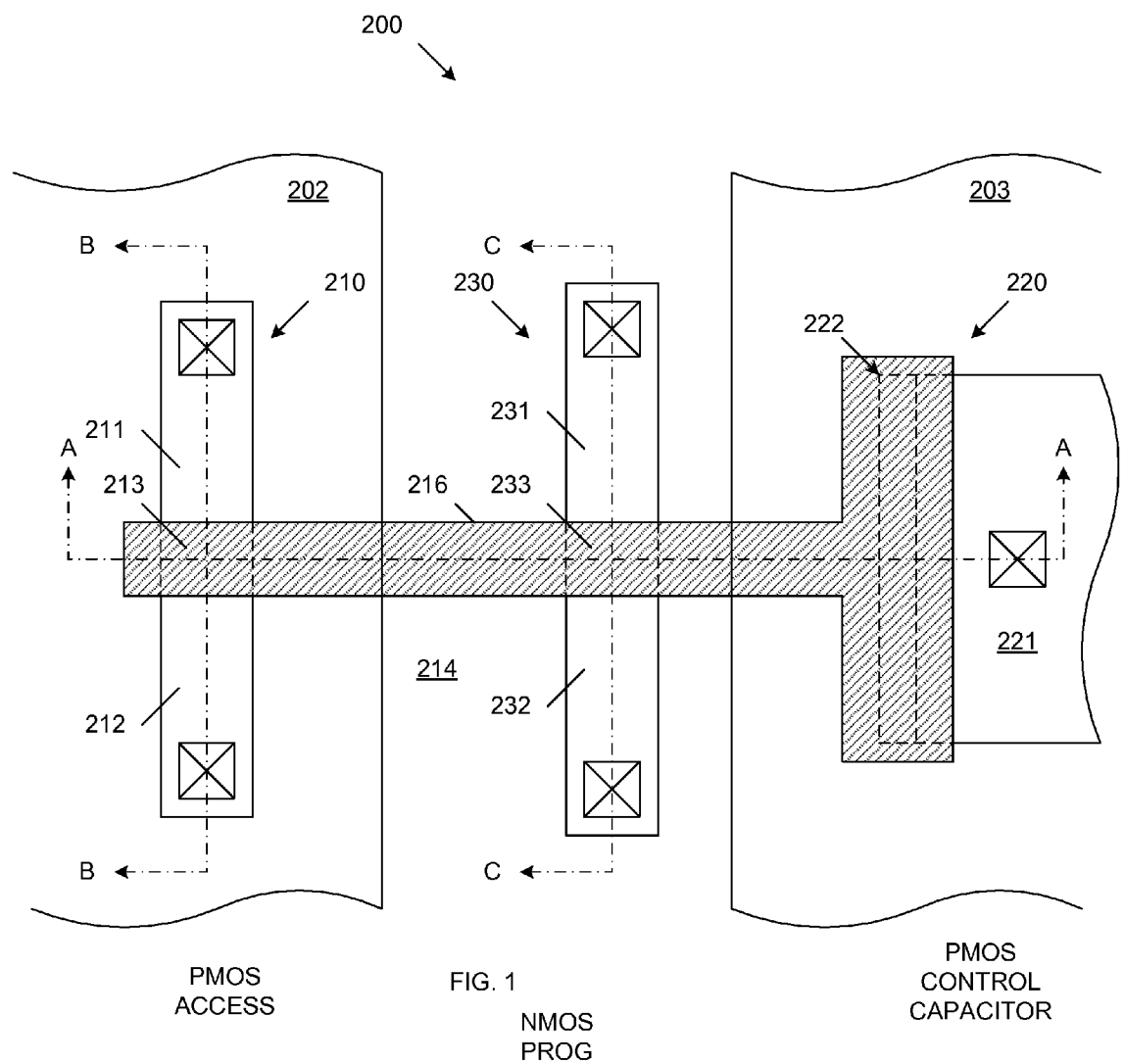
FIG. 1 is a top layout view of a non-volatile memory cell in accordance with one embodiment of the present invention.
Figure 2A:
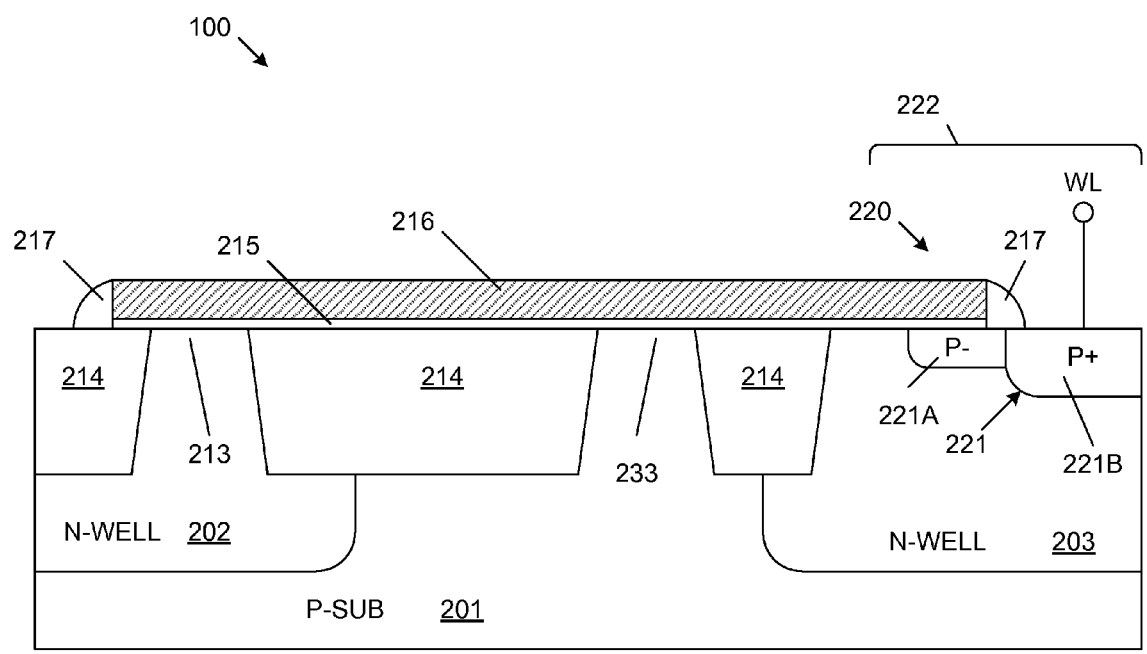
FIG. 2A is a cross-sectional view of the non-volatile memory cell of FIG. 1 along section line A-A.
Figure 2B:
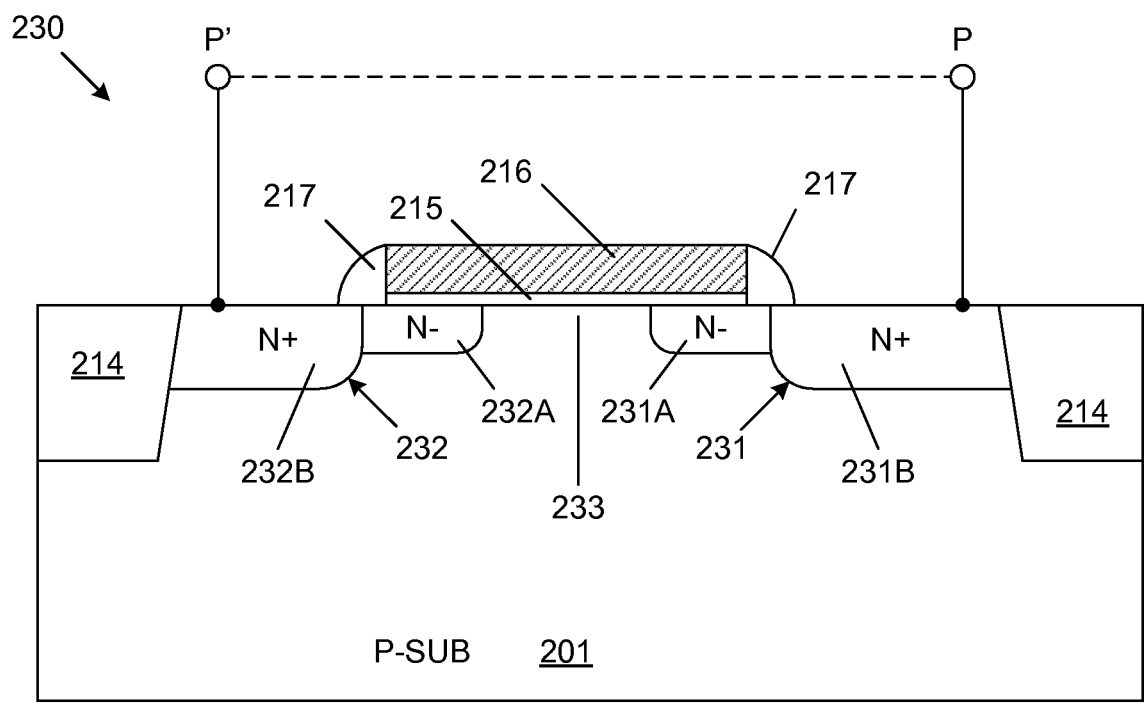
FIG. 2B is a cross-sectional view of the non-volatile memory cell of FIG. 1 along section line B-B.
Figure 2C:
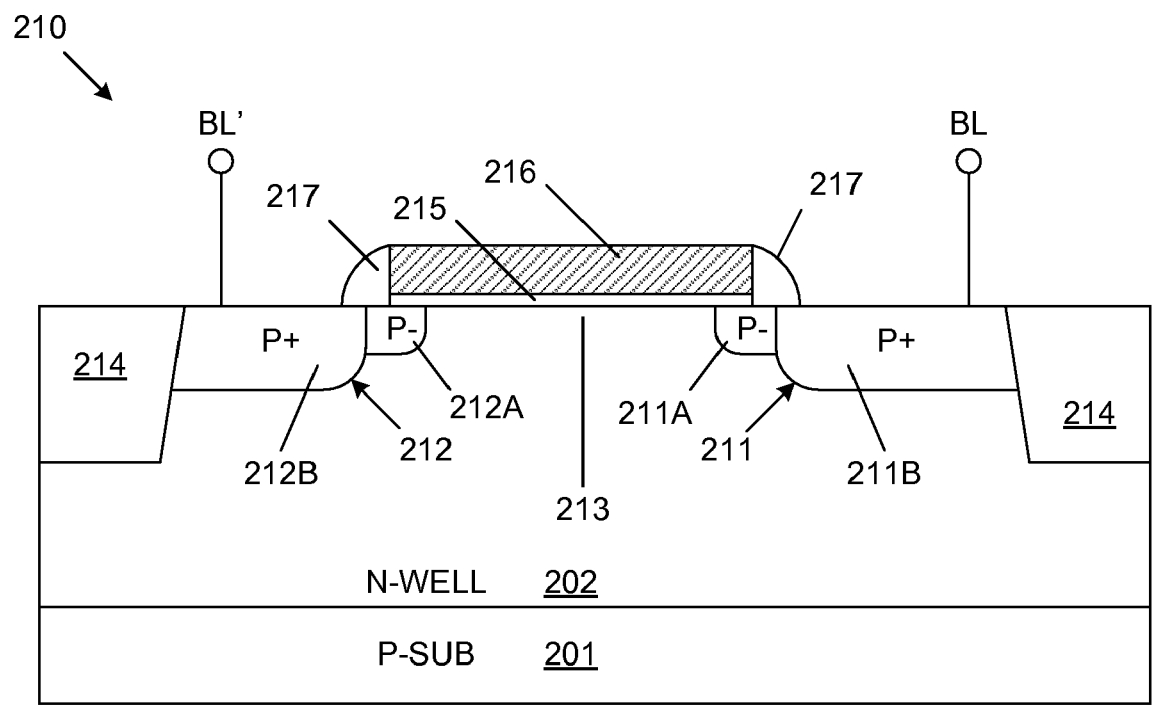
FIG. 2C is a cross-sectional view of the non-volatile memory cell of FIG. 1 along section line C-C.

FIG. 1 is a top layout view of a non-volatile memory cell 200 in accordance with one embodiment of the present invention. Non-volatile memory cell 200 includes a PMOS access transistor 210, a PMOS control capacitor 220 and an NMOS programming transistor 230. FIG. 2A is a cross sectional view of non-volatile memory cell 200 along section line A-A of FIG. 1. FIG. 2B is a cross sectional view of non-volatile memory cell 200 along section line B-B of FIG. 1. FIG. 2C is a cross sectional view of non-volatile memory cell 200 along section line C-C of FIG. 1. In the described example, non-volatile memory cell 200 is fabricated using a conventional logic process having low-voltage logic transistors and high-voltage input/output (I/O) transistors manufactured on the same chip. Non-volatile memory cell 200 is operated in response to a positive supply voltage ($V_{DD}$), which is characteristic to the conventional logic process (e.g., around 1 Volt), and a ground supply voltage ($V_{SS}$) of 0 Volts.

Non-volatile memory cell 200 is fabricated in a p-type mono-crystalline semiconductor substrate 201 (see FIGS. 2A, 2B, 2C). In the described embodiment, substrate 201 is p-doped silicon.

Field dielectric regions 214 surround the active regions of PMOS access transistor 210, PMOS control capacitor 220 and NMOS programming transistor 230. In the described embodiment, field dielectric region 214 includes shallow trench isolation (STI) regions, which define silicon islands (i.e., the active regions). Field dielectric region 214 may be made of silicon oxide or another dielectric material.

A gate dielectric layer 215 is located over selected portions of the active regions and field dielectric regions 214, as illustrated in FIGS. 2A-2C. In the described embodiment, gate dielectric layer 215 is silicon oxide; however, other dielectric materials can be used in other embodiments. Gate dielectric layer 215 has the same thickness as the gate dielectric layers used in the input/output (I/O) transistors (not shown) fabricated in substrate 201. In order to suppress gate leakage current, the gate dielectric layer 215 is usually thicker than the gate dielectric layers of logic transistors (not shown) fabricated in substrate 201. For example, gate dielectric layer 215 and the gate dielectric layers used in the I/O transistors may be silicon dioxide having a thickness of about 40 to 70 Angstroms in a 0.1 micron CMOS logic process, while the gate dielectric layers used in the logic transistors of the same process may be silicon dioxide having a thickness of about 15 to 22 Angstroms. In another embodiment of the present invention, gate dielectric layer 215 is not formed over field dielectric region 214.

A floating gate electrode 216 extends over the gate dielectric layer 215 and the field dielectric region 214, as illustrated in FIGS. 1 and 2A-2C. As viewed from the top, the floating gate electrode 216 and underlying gate dielectric layer exhibit a "T" shape in the described embodiment. In the described embodiment, floating gate electrode 216 includes conductively doped polycrystalline silicon. Sidewall spacer 217, which is typically formed from silicon nitride or silicon oxide or a combination thereof, is located at the edges of floating gate electrode 216.

As mentioned above, non-volatile memory cell 200 includes a PMOS access transistor 210. Access transistor 210 includes p-type source region 211 and p-type drain region 212 which are formed in an n-type well region 202, as depicted in FIGS. 1 and 2C. Source region 211 includes lightly doped P− source region 211A and heavily doped P+ source contact region 211B. Similarly, drain region 212 includes lightly doped P− drain region 212A and heavily doped P+ drain contact region 212B. Source region 211 is connected to a bit line (BL) line and drain region 212 is connected to an associated bit line (BL'). Floating gate electrode 216 forms the control gate of PMOS access transistor 210. PMOS access transistor 210 is isolated by adjacent field dielectric regions 214.

Non-volatile memory cell 200 also includes a NMOS programming transistor 230. Programming transistor 230 includes n-type source region 231 and n-type drain region 232, which are formed in p-type substrate 201 as depicted in FIGS. 1 and 2B. Source region 231 includes lightly doped n-type extension region 231A and heavily doped N+ source contact region 231B. Similarly, drain region 232 includes lightly doped n-type extension region 232A and heavily doped N+ drain contact region 232B. Source region 231 and drain region 232 are commonly connected to an associated programming line (P) during program, erase and read operations. Alternatively, source region 231 and drain region 232 can have separate contacts, which receive the same voltages during program, erase and read operations. Floating gate electrode 216 forms the control gate of NMOS programming transistor 230. NMOS programming transistor 230 is isolated by adjacent field dielectric regions 214.

Non-volatile memory cell 200 further includes PMOS control capacitor 220, which is formed in an active region 222. In the described embodiment, PMOS control capacitor 220 includes a p-type electrode region 221 formed in an N-well region 203. N-well region 203 is isolated from N-well region 202, such that different bias voltages can be applied to these N-well regions. P-type electrode 221 includes a lightly doped p-type extension region 221A and a heavily doped P+ contact region 221B, as illustrated in FIG. 2A. P-type electrode 221 extends under (and is capacitive coupled to) floating gate electrode 216. PMOS control capacitor 220 is isolated by adjacent field dielectric regions 214.

Figure 3:
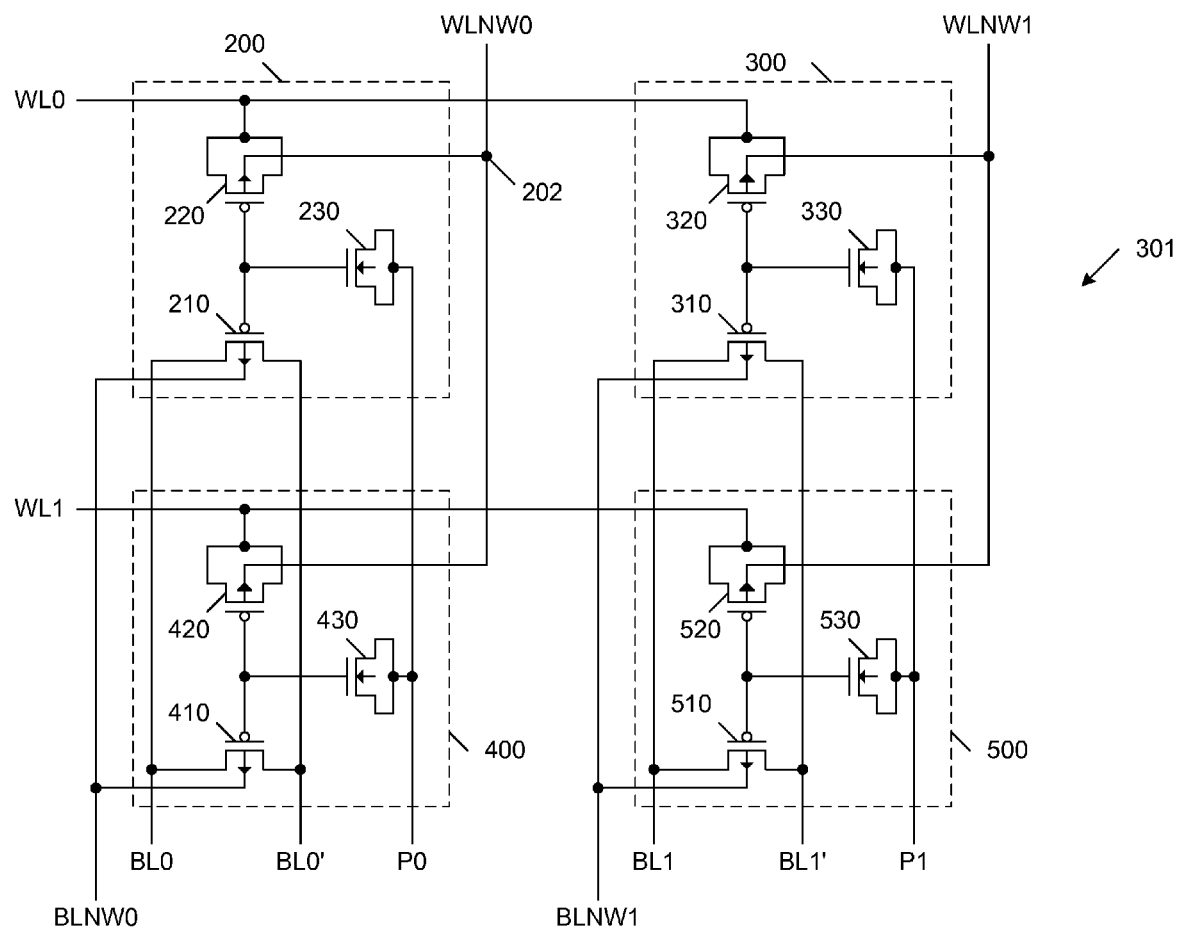
FIG. 3 is a schematic diagram of a 2×2 array constructed using the non-volatile memory cells of FIG. 1, in accordance with one embodiment of the present invention.

FIG. 3 is a schematic diagram of a 2×2 array 301 of non-volatile memory cells 200, 300, 400 and 500. Non-volatile memory cells 300, 400 and 500 are identical to above described non-volatile memory cell 200. Thus, non-volatile memory cells 300, 400 and 500 include PMOS access transistors 310, 410 and 510, NMOS programming transistors 330, 430 and 530, and PMOS control capacitors 320, 420 and 520, respectively. The source regions of PMOS access transistors 210 and 410 are commonly connected to conductive bit line electrode BL0, and the drain regions of PMOS access transistor 210 and 410 are commonly connected to conductive bit line electrode BL0'. Similarly, the source regions of PMOS access transistors 310 and 510 are commonly connected to conductive bit line electrode BL1, and the drain regions of PMOS access transistors 310 and 510 are commonly connected to conductive bit line electrode BL1'.

The p-type diffusion electrodes of PMOS control capacitors 220 and 320 are both connected to conductive word line electrode WL0. Similarly, the p-type diffusion electrodes of PMOS control capacitors 420 and 520 are connected to conductive word line electrode WL1.

The source and drain regions of NMOS programming transistors 230 and 430 are connected to conductive programming line electrode P0. Similarly, the source and drain regions of NMOS programming transistors 330 and 530 are connected to conductive programming line electrode P1.

The N-well regions of PMOS access transistors 210 and 410 are commonly connected to conductive bit line N-well electrode BLNW0. Similarly, the N-well regions of PMOS access transistors 310 and 510 are commonly connected to conductive bit line N-well electrode BLNW1.

The N-well regions of control capacitors 220 and 420 are commonly connected to conductive word line N-well electrode WLNW0. Similarly, the N-well regions of control capacitors 320 and 520 are commonly connected to conductive word line N-well electrode WLNW1.

Although the described array 301 includes two rows and two columns, it is understood that arrays having other sizes can be implemented in accordance with other embodiments of the present invention.

Figure 4C:
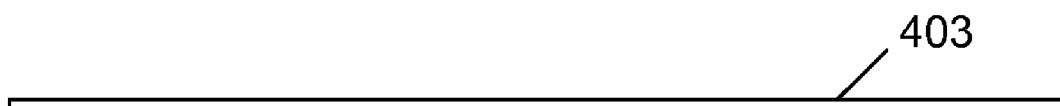

FIGS. 4A, 4B and 4C describe programming, erase and read operations, respectively, of the array 301 of FIG. 3, in accordance with one embodiment of the present invention. A program operation, as defined herein, is an operation wherein negative charge is added to the floating gate. An erase operation, as defined herein, is an operation whereby negative charge is removed from the floating gate, thereby resulting in a net positive charge to the floating gate.

The programming mode is described in connection with the programming of non-volatile memory cell 200. In the programming mode, an inversion channel is created under the portion of floating gate 216 overlapping the channel region 233 of NMOS program transistor 230. Thus, there is a large voltage drop between floating gate 216 and the inversion channel of NMOS programming transistor 230. As a result, electrons tunnel from the n-channel inversion layer to floating gate 216 via Fowler-Nordheim tunneling, a direct tunneling mechanism or a combination thereof, through gate dielectric layer 215 of NMOS programming transistor 230. As a result, the threshold voltage ($V_{TP}$) of PMOS access transistor 210 becomes less negative.

FIG. 4A is a table 401 which illustrates the specific programming voltages required to program non-volatile memory cell 200 in a particular embodiment. Word line signal WL0 and n-well signal WLNW0 are held at 10 Volts, while bit line signals BL0-BL0' and n-well signal BLNW0 are held at 5 Volts. It is noted that p-type substrate 201 is always held at 0 Volts in all embodiments and examples of this invention. The programming line P0 is held at 0 Volts. Under these bias conditions, the NMOS program transistor 230 will be inverted. A high voltage drop of about 9 Volts exists across the gate dielectric layer 215 of NMOS programming transistor 230, with the electric field approaching or even exceeding 10 Mega-Volts per centimeter (MV/cm). Under these conditions, electrons in the inversion layer of NMOS programming transistor 230 tunnel to floating gate 216. The electron charge added on floating gate 216 makes the threshold voltage of PMOS access transistor 210 more positive.

In the present example, non-volatile memory cell 300 is not to be programmed. To prevent electrons from tunneling into the floating gate electrode of non-volatile memory cell 300, programming line P1 is held at a voltage of about 5 Volts. Bit lines BL1-BL1' are also held at a voltage of about 5 Volts. Under these conditions, the voltage drop across NMOS programming capacitor 330 is substantially less than the voltage required for Fowler-Nordheim tunneling. Thus, no significant electron tunneling occurs within NVM cell 300.

In the present example, non-volatile memory cells 400 and 500 are also not to be programmed. To prevent programming of memory cells 400 and 500, word line WL1 is held at 5 Volts. Under these bias conditions, the maximum voltage drop across the gate dielectric layer of NVM cells 400 and 500 is less than 4 Volts, which is substantially less than the voltage required for Fowler-Nordheim tunneling. Thus, no significant electron tunneling occurs within NVM cells 400 and 500.

During an erase operation, net negative charge is removed from the floating gate of memory cell 200, thereby making the threshold voltage of PMOS access transistor 210 more negative. The erase operation implements Fowler-Nordheim tunneling between the floating gate 216 and the channel and source/drain regions of PMOS access transistor 210, with electrons tunneling out of floating gate 216 and holes tunneling into floating gate 216.

FIG. 4B is a table 402 which illustrates the specific erase voltages required to erase non-volatile memory cell 200 in a particular embodiment. Word line signal WL0 and n-well signal WLNW0 are held at 0 Volts, while bit line signals BL0-BL0' and n-well signal BLNW0 are held at 10 Volts. The programming line P0 is held 0 Volts. Under these bias conditions, the PMOS access transistor 210 will be inverted. That is, an inversion layer will be created under floating gate 216 within PMOS access transistor 210. A high voltage drop of about 9 Volts exists across the gate dielectric layer 215 of PMOS access transistor 210, with the electric field approaching or even exceeding 10 Mega-Volts per centimeter (MV/cm). Therefore, electrons will tunnel from floating gate 216 into the inversion layer within PMOS access transistor 210. The effective electron charge on floating gate 216 is reduced, thereby making the threshold voltage of PMOS access transistor 210 more negative.

In the present example, non-volatile memory cell 300 is not to be erased. To prevent electrons from tunneling away the floating gate electrode of non-volatile memory cell 300, bit line signals BL1-BL1' and n-well signal BLNW1 are held at 0 Volts, n-well signal WLNW1 is held at 5 Volts, and programming signal P1 is held at 0 Volts. Under these conditions, the voltage drop across the gate dielectric of PMOS access transistor 310 is substantially less than the voltage required for Fowler-Nordheim tunneling. Thus, no significant electron tunneling occurs within NVM cell 300.

In the present example, non-volatile memory cells 400 and 500 are also not to be erased. To prevent electrons tunneling away the floating gate electrodes of non-volatile memory cells 400 and 500, word line WL1 is held at 5 volts. Under these conditions, the voltage drop across the gate dielectric layers of PMOS access transistors 410 and 510 is substantially less than the voltage required for Fowler-Nordheim tunneling. Thus, no significant electron tunneling occurs within NVM cells 400 and 500.

During a read operation, a read control voltage is applied to the gate of a PMOS access transistor via the associated word line. A drain read voltage is also applied to the drain of the PMOS access transistor via an associated bit line. The read control voltage, coupled with the drain read voltage, will generate current through the associated PMOS access transistor. The amount of such current depends on the programmed or erased state of the associated NVM cell. The current through the PMOS access transistor is sensed, thereby determining whether the associated NVM cell is programmed or erased.

FIG. 4C is a table 403 which defines specific read voltages required to read non-volatile memory cells 200 and 300 in a particular embodiment. Word line WL0 is held at a voltage of −1 Volts. Bit line signals BL0-BL1 and n-well signals BLNW0 and BLNW1 are held at a voltage of 0.5 Volts. Bit line signals BL0'-BL1', programming signals P0-P1, n-well signals WLNW0-WLNW1 and p-type substrate 201 are all held at a voltage of 0 Volts. Under these conditions, larger read current will flow through the PMOS access transistors of programmed NVM cells, and smaller read current will flow through the PMOS access transistors of erased NVM cells. The non-selected word line WL1 is held at a voltage of 0 Volts or some small positive voltage in the normal read mode, thereby turning off the PMOS access transistors 410 and 510 in the non-selected row. Turning off PMOS access transistors 410 and 510 prevents current from flowing through these transistors into bit lines BL0 and BL1. As a result, NVM cells 400 and 500 do not interfere with the bit line signals from the selected NVM cells 200 and 300.

FIGS. 4A and 4B depict programming and erasing of non-volatile memory cell 200 only, while the other NVM cells 300, 400 and 500 do not change state. However, both programming and erase operations can be performed in a sector-like fashion, wherein all NVM cells 200, 300, 400 and 500 are acted upon at the same time. For example, a sector-like programming operation can be performed by setting the word line signals WL0 and WL1 and the programming signals P0 and P1 to a voltage of 10 Volts, while maintaining the other programming voltages specified in table 401 of FIG. 4A. This sector-like programming operation would result in programming the memory cells 200, 300, 400 and 500 in all rows and columns of array 301.

Similarly, a sector-like erase operation can be performed by setting the signals BL0, BL0', BL1, BL1', BLNW0 and BLNW1 at 10 Volts, and setting the word line signals WL0 and WL1 at 0 Volts, while maintaining the other erase voltages specified in Table 402 of FIG. 4B. This sector-like erase operation would result in erasing the memory cells 200, 300, 400 and 500 in all rows and columns of array 301.

Figure 5:
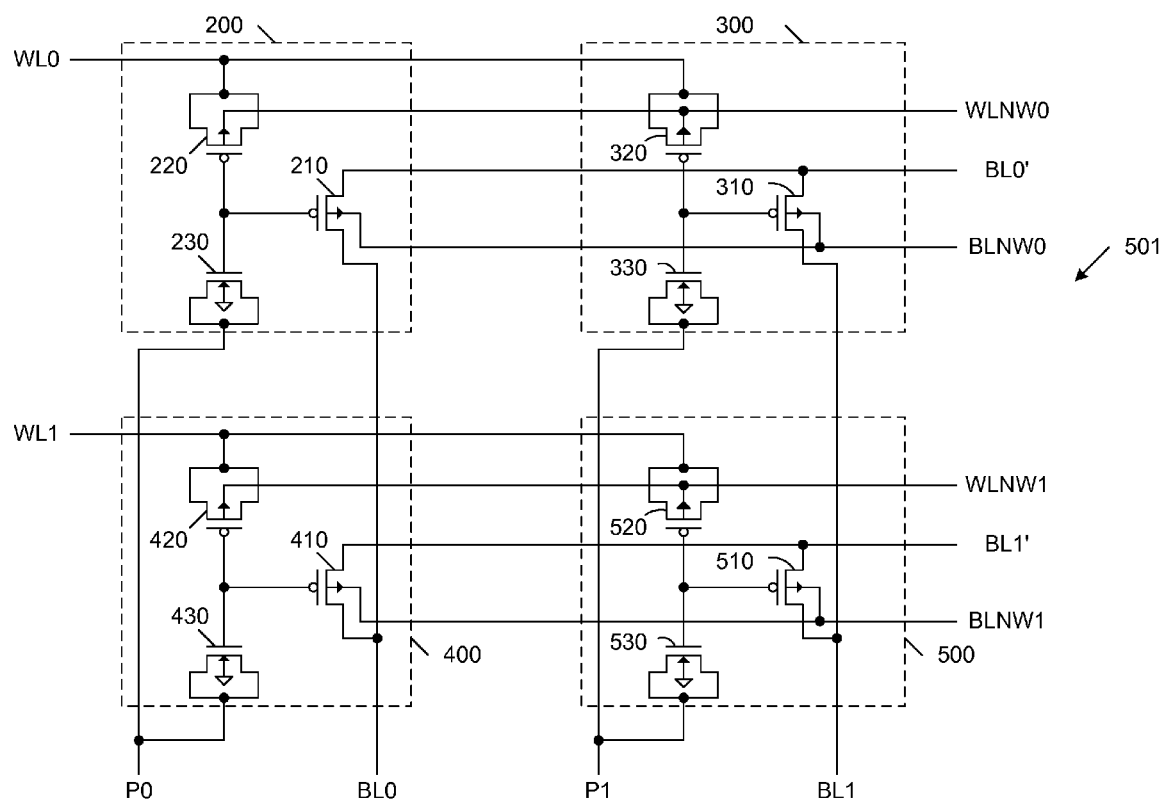
FIG. 5 is a schematic diagram of a 2×2 array constructed using the non-volatile memory cells of FIG. 1, in accordance with an another embodiment of the present invention.

FIG. 5 is a schematic diagram of a 2×2 array 501 of non-volatile memory cells 200, 300, 400 and 500, arranged in accordance with an alternative embodiment of the present invention.

Within array 501, the source regions of PMOS access transistors 210 and 410 are commonly connected to bit line BL0, and the drain regions of PMOS access transistors 210 and 310 are commonly connected to bit line BL0'. The source regions of PMOS access transistors 310 and 510 are commonly connected to bit line BL1, and the drain regions of PMOS access transistors 410 and 510 are commonly connected to bit line BL1'.

Word lines WL0 and WL1 and programming lines P0-P1 are connected to memory cells 200, 300, 400 and 500 in the same manner described above for array 301 (FIG. 3).

The n-well regions associated with PMOS access transistors 210 and 310 are coupled to receive the n-well bias signal BLNW0. Similarly, the n-well regions associated with PMOS access transistors 410 and 510 are coupled to receive the n-well bias signal BLNW1.

The n-well regions associated with PMOS control capacitors 220 and 320 are coupled to receive the n-well bias signal WLNW0. Similarly, the n-well regions associated with PMOS control capacitors 420 and 520 are coupled to receive the n-well bias signal WLNW1. Like array 301, array 501 can be modified to implement arrays of other sizes.

FIGS. 6A and 6B define program and erase operations, respectively, of array 501 in accordance with one embodiment of the present invention.

FIG. 6A is a table 601 illustrating the various voltages used to program memory cell 200 in accordance with one embodiment of the present invention. Word line signal WL0 and N-well bias signal WLNW0 are both held at a voltage of about 10 Volts. Bit lines BL0-BL0' and BL1-BL1' and n-well bias signal BLNW0 are all held at a voltage of about 5 Volts. Program signal P0 is held at 0 Volts. Under these bias conditions, an inversion layer is created under floating gate 216 within NMOS program transistor 230 and a high voltage drop of about 9 Volts exists across the gate dielectric layer 215 of NMOS programming transistor 230 (wherein the voltage on floating gate 216 is high). This bias scheme causes electrons to tunnel into the floating gate electrode 216 from the inversion channel of NMOS program transistor 230, thereby causing the threshold voltage ($V_{TP}$) of PMOS access transistor 210 to become less negative.

Programming signal P1 is held at a voltage of about 5 Volts, thereby preventing memory cell 300 from being programmed. Word line signal WL1 and n-well bias signal WLNW1 are both held at 0 Volts, and n-well bias signal BLNW1 is held at 5 Volts, thereby preventing memory cells 400 and 500 from being programmed. That is, memory cells 300, 400 and 500 exhibit significantly less voltage drop across their respective gate dielectric layers (between 4 and 5 Volts) under the bias conditions of table 601, which prevents carrier tunneling across their respective gate dielectric layers.

FIG. 6B is a table 602 illustrating the various voltages used to simultaneously erase memory cells 200, 300, 400 and 500 in accordance with one embodiment of the present invention. Word line signals WL0-WL1 and n-well bias voltages WLNW0 and WLNW1 are held at 0 Volts. Bit line signals BL0, BL0', BL1 and BL1' and n-well bias voltages BLNW0 and BLNW1 are held at 10 Volts. Programming lines P0 and P1 are held at 0 Volts. Under these bias conditions, inversion channels are created under the floating gates of PMOS access transistors 210, 310, 410 and 510. Moreover, each of the non-volatile memory cells 200, 300, 400 and 500 experiences a voltage drop of about 9 Volts across the gate dielectric layers of PMOS access transistors 210, 310, 410 and 510, with the floating gates of these transistors being held at low voltages. As a result, electrons tunnel from the floating gates to the inversion channels of PMOS access transistors 210, 310, 410 and 510, thereby making the threshold voltages ($V_{TP}$) of PMOS access transistors 210, 310, 410 and 510 more negative.

The memory cells of array 501 can be read using the same read bias voltages defined above in table 403 (FIG. 4C).

Figure 7:
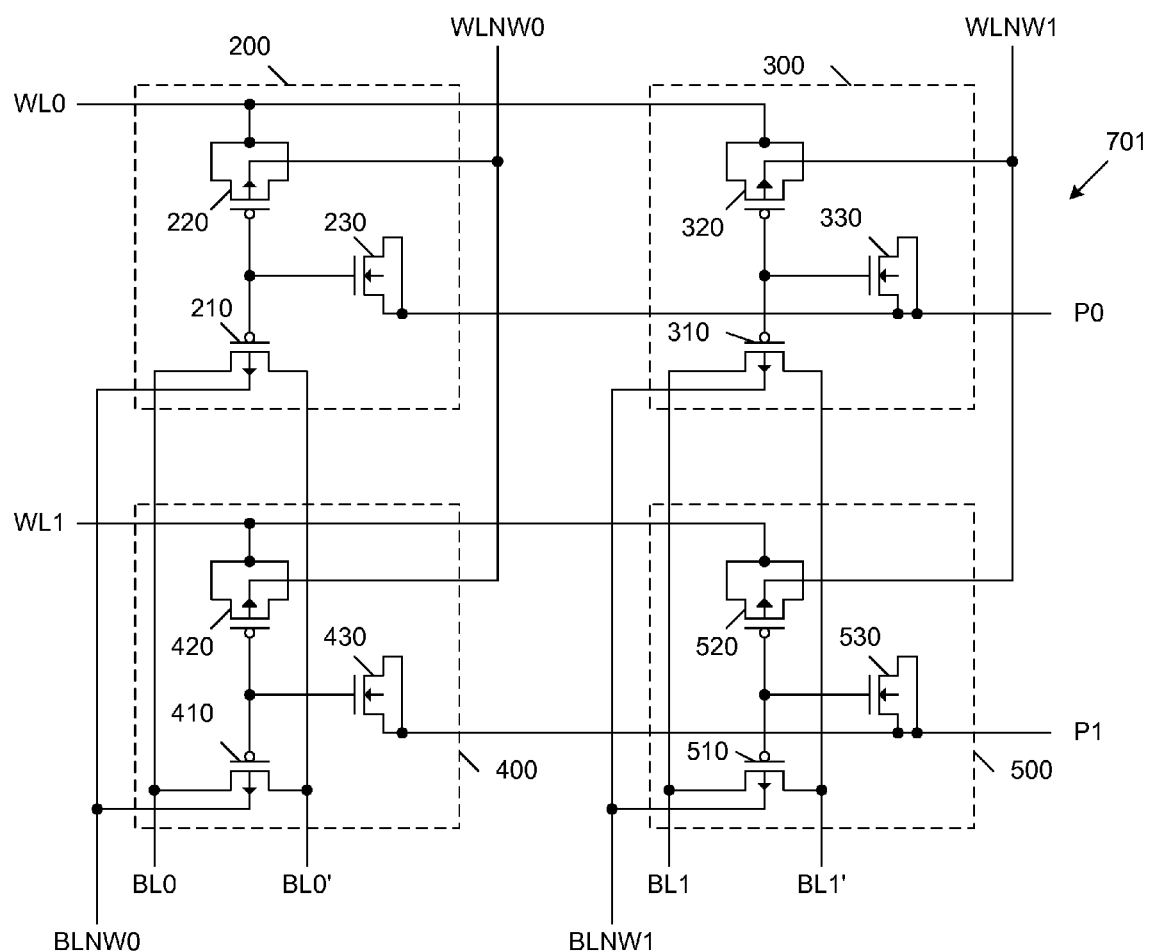
FIG. 7 is a schematic diagram of a 2×2 array constructed using the non-volatile memory cells of FIG. 1, in accordance with yet another embodiment of the present invention.

FIG. 7 is a schematic diagram of a 2×2 array 701 of non-volatile memory cells 200, 300, 400 and 500, arranged in accordance with another embodiment of the present invention.

Within array 701, word lines WL0 and WL1, bit lines BL0, BL0', BL1 and BL1', and n-well bias lines BLNW0, BLNW1, WLNW0 and WLNW1 are connected to memory cells 200, 300, 400 and 500 in the same manner described above for array 301 (FIG. 3). However, programming line P0 is connected to the source/drain regions of NMOS programming transistors 230 and 330, while programming line P1 is connected to the source/drain regions of NMOS programming transistors 430 and 530. Thus, the connections of array 701 are similar to the connections of array 301, except that the program lines P0-P1 of array 701 are connected in parallel with the related word lines WL0-WL1. Like array 301, array 701 can be modified to implement arrays of other sizes.

FIG. 8 defines a program operation of array 701 in accordance with one embodiment of the present invention.

FIG. 8 is a table 801 illustrating the various voltages used to program all memory cells 200, 300, 400 and 500 in accordance with one embodiment of the present invention. Word line signals WL0-WL1, bit line signals BL0-BL0' and BL1-BL1' and n-well signals WLNW0, WLNW1, BLNW0 and BLNW1 are all held at a voltage of about 10 Volts. Program signals P0 and P1 are held at 0 Volts. Under these bias conditions, an inversion layer is created under the floating gates within NMOS program transistors 230, 330, 430 and 530, and a high voltage drop of about 9 Volts exists across the gate dielectric layers of these NMOS programming transistors (wherein the voltage on floating gate 216 is high). This bias scheme causes electrons to tunnel into the floating gate electrodes from the inversion channel of NMOS program transistors 230, 330, 430 and 530, thereby causing the threshold voltage ($V_{TP}$) of PMOS access transistor 210 to become less negative.

In the described embodiment, memory cells 200, 300, 400, and 500 in array 701 are programmed in a sector-like manner, but are erased on a cell-by-cell basis. In one embodiment, the memory cell 200 of array 701 is erased using the same bias voltages defined in table 402 (FIG. 4B). Under these bias conditions, a high voltage of about 9 volts develops between floating gate 216 and the inversion layer of PMOS access transistor 210. Thus, electrons tunnel from floating gate 216 to the inversion layer of PMOS access transistor 210, and holes tunnel in the opposite direction. Therefore, the threshold voltage of PMOS access transistor 210 becomes more negative. The non-selected memory cells 300, 400 and 500 see significantly smaller voltage drop across their respective gate dielectric layers (less than 5 Volts), thereby preventing carriers from tunneling across their respective gate dielectric layers.

In a variation of this embodiment, the programming line P1 is held at a voltage of 5 Volts, thereby reducing the voltage across the gate dielectric of PMOS access transistor 410.

The memory cells of array 701 are read using the same read bias voltages illustrated in table 403 (FIG. 4C).

Figure 9:
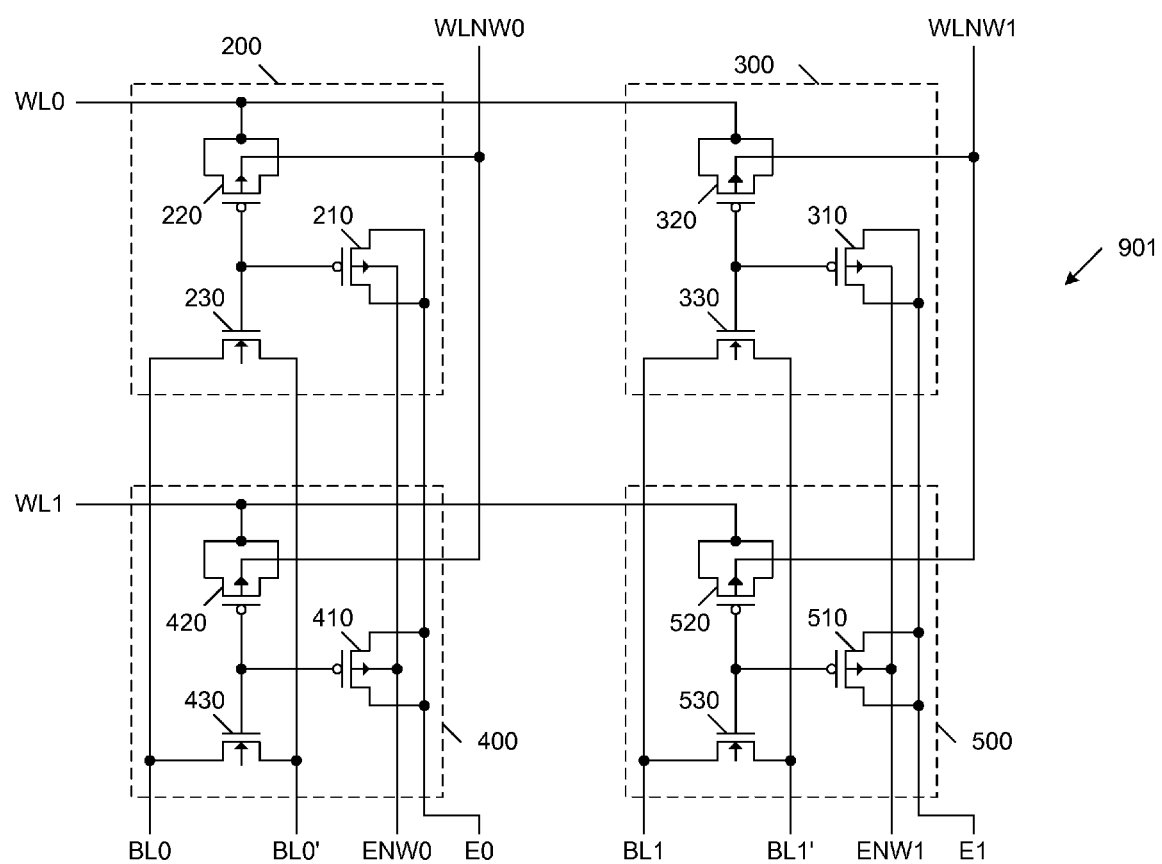
FIG. 9 is a schematic diagram of a 2×2 array constructed using non-volatile memory cells of an alternate embodiment of the present invention.
Figure 11:
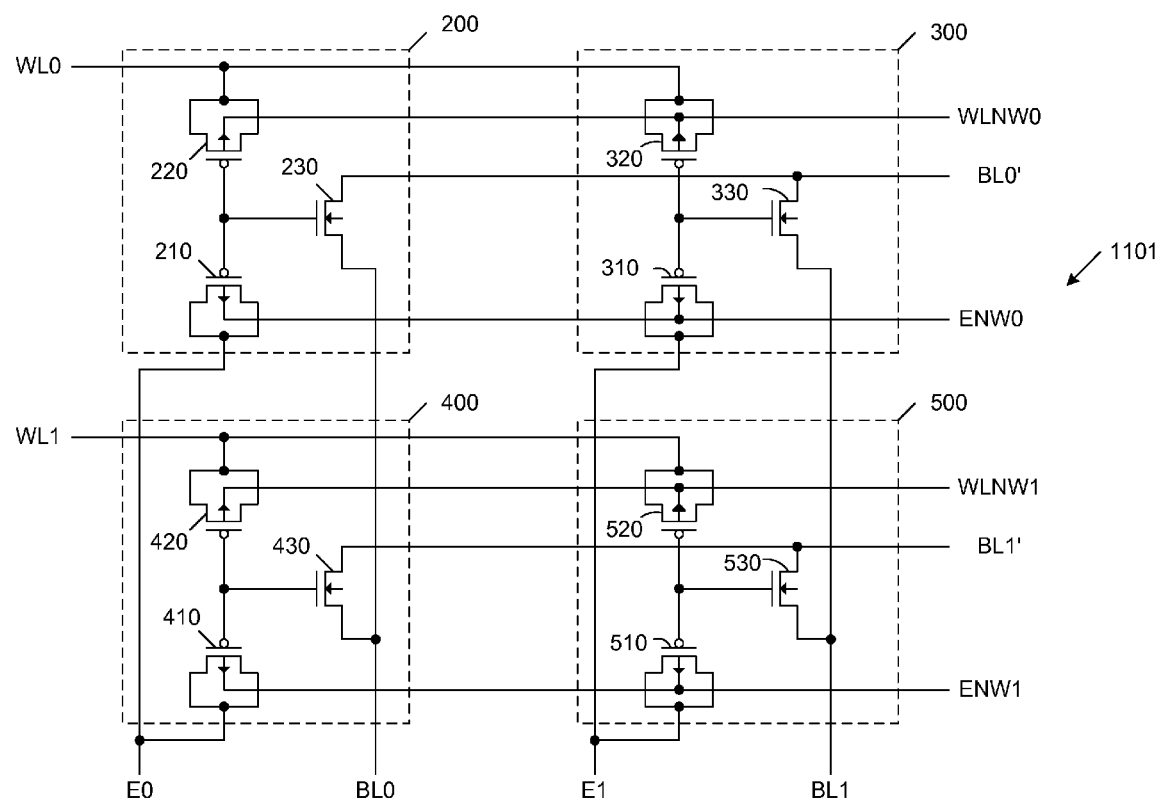
FIG. 11 is a schematic diagram of a 2×2 array constructed using the non-volatile memory cells of FIG. 9, in accordance with an another embodiment of the present invention.
Figure 13:
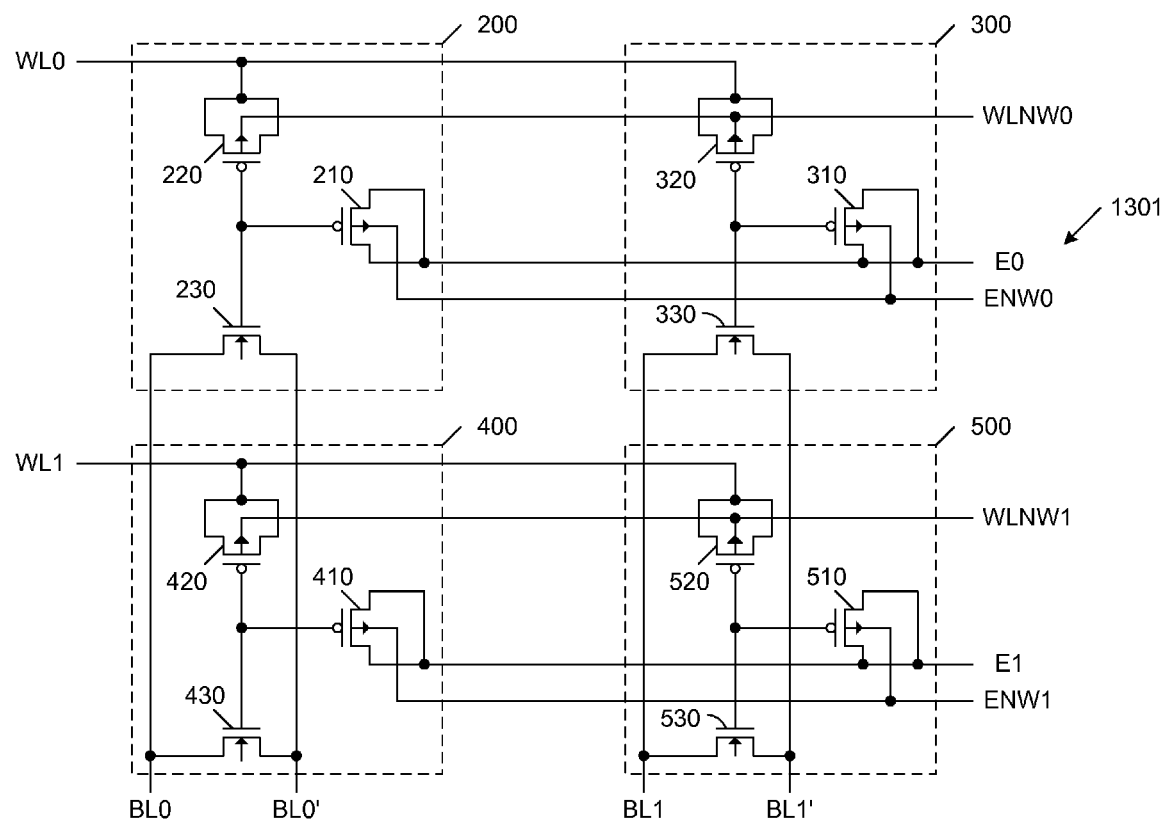
FIG. 13 is a schematic diagram of a 2×2 array constructed using the non-volatile memory cells of FIG. 9, in accordance with yet another embodiment of the present invention.

In accordance with another series of embodiments, NMOS programming transistor 230 of cell 200 is used as an access transistor, while PMOS access transistor 210 is used as an erase transistor (or an erase capacitor). FIGS. 9, 11 and 13 are circuit diagrams illustrating 2×2 arrays 901, 1101 and 1301, respectively, which use the memory cell transistors in this manner.

FIG. 9 is a circuit diagram of array 901, which is configured in a manner similar to array 301 (FIG. 3), with the PMOS access transistors and the NMOS programming transistors of array 301 switching places to become PMOS erase transistors and NMOS access transistors, respectively. More specifically, in array 901, NMOS access transistors 230 and 430 are connected to bit lines BL0-BL0', while NMOS access transistors 330 and 530 are connected to bit lines BL1-BL1'. The source/drain regions of PMOS erase transistors 210 and 410 are commonly coupled to erase line E0, while the source/drain regions of PMOS erase transistors 310 and 510 are commonly coupled to erase line E1. The n-well regions of PMOS erase transistors 210 and 410 are commonly coupled to n-well bias line ENW0, while the n-well regions of PMOS erase transistors 310 and 510 are commonly coupled to n-well bias line ENW1. PMOS capacitors 220, 320, 420 and 520 are connected in the same manner in arrays 901 and 301.

FIGS. 10A, 10B and 10C are tables that define program, erase and read operations, respectively, of array 901 in accordance with one embodiment of the present invention.

FIG. 10A is a table 1001 illustrating the various voltages used to program memory cell 200 of array 901 in accordance with one embodiment of the present invention. Word line signal WL0 and N-well bias signals WLNW0-WLNW1 are held at a voltage of about 10 Volts. Word line WL1, bit lines BL1-BL1', erase lines E0-E1 and n-well bias signals ENW0-ENW1 are all held at a voltage of about 5 Volts. Bit lines BL0-BL0' are held at 0 Volts. Under these bias conditions, an inversion layer is created under floating gate 216 within NMOS program transistor 230 and a high voltage drop of about 9 Volts exists across the gate dielectric layer 215 of NMOS access transistor 230 (wherein the voltage on floating gate 216 is high). This bias scheme causes electrons to tunnel into the floating gate electrode 216 from the inversion channel of NMOS access transistor 230, thereby causing the threshold voltage ($V_{TN}$) of NMOS access transistor 210 to become more positive. Memory cells 300, 400 and 500 exhibit significantly less voltage drop across their respective gate dielectric layers (between 4 and 5 Volts) under the bias conditions of table 1001, which prevents carrier tunneling across their respective gate dielectric layers.

FIG. 10B is a table 1002 illustrating the various voltages used to erase memory cell 200 of array 901 in accordance with one embodiment of the present invention. Word line signal WL0, bit line signals BL0, BL0', BL1 and BL1', erase signal E1 and n-well bias signal ENW1 are held at 0 Volts. Word line signal WL1 and n-well bias voltages WLNW0 and WLNW1 are held at 5 Volts. Erase signal E0 and n-well bias signal ENW0 are both held at 10 Volts. Under these bias conditions, inversion channels are created under the floating gates of PMOS erase transistor 210, and a voltage drop of about 9 Volts exists across the gate dielectric layer of PMOS erase transistor 210, with floating gate 216 being held at a low voltage). As a result, electrons tunnel from the floating gate to the inversion channels of PMOS erase transistor 210, thereby making the threshold voltages ($V_{TN}$) of NMOS access transistor 230 less positive.

FIG. 10C is a table 1003 illustrating the various voltages used to read non-volatile memory cells 200 and 300 of array 901 in a particular embodiment. Word line WL0 and n-well bias voltages WLNW0 and WLNW1 are held at a voltage of 1 Volt. Bit line signals BL0 and BL1 are held at a voltage of 0.5 Volts. Word line signal WL1, bit line signals BL0' and BL1', erase signals E0 and E1, and n-well bias signals ENW0 and ENW1 are all held at a voltage of 0 Volts. Under these conditions, larger read current will flow through the NMOS access transistors of erased NVM cells, and smaller read current will flow through the NMOS access transistors of programmed NVM cells. The non-selected word line WL1 is held at a voltage of 0 Volts, thereby turning off the NMOS access transistors 410 and 510 in the non-selected row.

FIG. 11 is a circuit diagram of array 1101, which is configured in a manner similar to array 501 (FIG. 5), with the PMOS access transistors and the NMOS programming transistors of array 501 switching places to become PMOS erase transistors and NMOS access transistors, respectively. More specifically, in array 1101, the sources of NMOS access transistors 230 and 430 are connected to bit line BL0, while the sources of NMOS access transistors 330 and 530 are connected to bit line BL1. The drains of NMOS access transistors 230 and 330 are connected to bit line BL0', while the drains of NMOS access transistors 430 and 530 are connected to bit line BL1'. The source/drain regions of PMOS erase transistors 210 and 410 are commonly coupled to erase line E0, while the source/drain regions of PMOS erase transistors 310 and 510 are commonly coupled to erase line E1. The n-well regions of PMOS erase transistors 210 and 310 are commonly coupled to n-well bias line ENW0, while the n-well regions of PMOS erase transistors 410 and 510 are commonly coupled to n-well bias line ENW1. PMOS capacitors 220, 320, 420 and 520 are connected in the same manner in arrays 1101 and 501.

FIGS. 12A and 12B are tables that define program and erase operations, respectively, of array 1101 in accordance with one embodiment of the present invention.

FIG. 12A is a table 1201 illustrating the various voltages used to program all memory cells of array 1100 in accordance with one embodiment of the present invention. Word line signals WL0 and WL1, erase signals E0-E1, n-well bias signals WLNW0-WLNW1 and ENW0-ENW1 are all held at a voltage of about 10 Volts. Bit lines BL0-BL0' and BL1-BL1' are all held at 0 Volts. Under these bias conditions, an inversion layer is created under the floating gates of the NMOS access transistors 230, 330, 430 and 530, and a high voltage drop of about 9 Volts exists across the gate dielectric layers of these NMOS access transistors (wherein the voltage on floating gates are high). This bias scheme causes electrons to tunnel into the floating gate electrodes from the inversion channel of NMOS access transistors, thereby causing the threshold voltage ($V_{TN}$) of the NMOS access transistors to become more positive.

FIG. 12B is a table 1202 illustrating the various voltages used to erase memory cell 200 of array 1100 in accordance with one embodiment of the present invention. Word line signal WL0, bit line signals BL0-BL0' and BL1-BL1' and n-well bias signal WLNW0 are all held at 0 Volts. Word line WL1, n-well bias signal WLNW1 and erase signal E1 are all held at a voltage of about 5 Volts. Erase signal E0 and n-well bias signal ENW0 are held at a voltage of about 10 Volts.

Under these bias conditions, an inversion layer is created under the floating gates of the PMOS erase transistor 210, a high voltage (~9 volts) develops between floating gate node 216 and the inversion channel of PMOS erase transistor 210. This results in the tunneling of electrons from floating gate 216 into the channel of PMOS erase transistor 210 and the tunneling of holes from the inversion layer of PMOS erase transistor 210 into floating gate 216, thereby causing the threshold voltage ($V_{TN}$) Of the NMOS access transistor 230 to become less positive.

Erase signal E1 is held at a voltage of about 5 Volts, thereby preventing memory cell 300 from being erased. Word line signal WL1 and n-well bias signal WLNW1 are both held at 5 Volts, and n-well bias signal ENW1 is held at 5 Volts, thereby preventing memory cells 400 and 500 from being erased.

Read operations from array 1101 are performed using substantially the same read bias voltages set forth in table 1003 of FIG. 10C. The only difference is that when reading from array 1101, the n-well bias signal associated with a row not being read (e.g., WLNW1) is held at 0 Volts (as opposed to 1 Volt in table 1003).

FIG. 13 is a schematic diagram of a 2×2 array 1301 of non-volatile memory cells 200, 300, 400 and 500, arranged in accordance with another embodiment of the present invention.

Within array 1301, word lines WL0 and WL1 and bit lines BL0, BL0', BL1 and BL1' are connected to memory cells 200, 300, 400 and 500 in the same manner described above for array 901 (FIG. 9). However, erase line E0 is connected to the source/drain regions of PMOS erase transistors 210 and 310, while erase line E1 is connected to the source/drain regions of PMOS erase transistors 410 and 510. Similarly, the n-well regions of PMOS erase transistors 210 and 310 are commonly connected to receive n-well bias signal ENW0, while the n-well regions of PMOS erase transistors 410 and 510 are commonly connected to receive n-well bias signal ENW1. The n-well regions of PMOS capacitors 220 and 320 are commonly connected to receive n-well bias signal WLNW0, while the n-well regions of PMOS capacitors 420 and 520 are commonly connected to receive n-well bias signal WLNW1. Thus, the connections of array 1301 are similar to the connections of array 901, except that the erase lines and n-well bias lines of array 1301 extend in parallel with the related word lines WL0-WL1. Like array 901, array 1301 can be modified to implement arrays of other sizes.

FIGS. 14A and 14B are tables that define program and erase operations, respectively, of array 1301 in accordance with one embodiment of the present invention.

FIG. 14A is a table 1401 illustrating the various voltages used to program all memory cells of array 1100 in accordance with one embodiment of the present invention. Word line signal WL0 and n-well bias signal WLNW0 are held at a voltage of about 10 Volts. Bit line signals BL1-BL1', erase signal E0 and n-well bias signal ENW0 are all held at a voltage of about 5 Volts. Word line signal WL1, bit line signals BL0-BL0', erase signal E1 and n-well bias signals WLNW1 and ENW1 are all held at 0 Volts.

Under these bias conditions, a high voltage of about 9 volts develops between floating gate 216 and the inversion channel of access transistor 230, thereby causing electrons in the inversion channel of NMOS access transistor 230 to tunnel through the gate dielectric layer 215 into floating gate 216, thereby making threshold voltage of NMOS access transistor 230 more positive. These bias voltages also prevent channeling in memory cells 300, 400 and 500 by limiting the voltage applied across the gate dielectric layers in these cells.

FIG. 14B is a table 1402 illustrating the various voltages used to erase memory cells 200, 300, 400 and 500 of array 1301 in accordance with one embodiment of the present invention. Word line signals WL0 and WL1, bit lines BL0-BL0' and BL1-BL1', and n-well bias signals WLNW0-WLNW1 are all held at 0 Volts. Erase signals E0-E1 and n-well bias signals ENW0-ENW1 are all held at a voltage of about 10 Volts. Under these bias conditions, electrons tunnel from the floating gates of memory cells 200, 300, 400 and 500 to the inversion channels of PMOS erase transistors 210, 310, 410, 510 (and holes tunnel in the opposite direction). As a result, the threshold voltages of NMOS access transistors 230, 330, 430 and 530 all become less positive.

Read operations from array 1301 are performed using the same read bias voltages used to read array 1101.

Although the present invention has been described in connection with various embodiments, it is understood that variations of these embodiments would be obvious to one of ordinary skill in the art. Thus, the present invention is limited only by the following claims.

We claim:

1. A non-volatile memory system including one or more non-volatile memory cells fabricated on a semiconductor substrate, wherein each non-volatile memory cell comprises:
   a floating gate electrode;
   a PMOS access transistor located in a first n-type region, wherein the PMOS access transistor is configured to remove negative charge from the floating gate electrode during an erase operation, and is further configured to supply current to be sensed during a read operation;
   a PMOS control capacitor located in a second n-type region, which is separate from the first n-type region; and
   an NMOS programming transistor located in a p-type region, wherein the NMOS programming transistor is configured to add negative charge to the floating gate electrode during an program operation, wherein the floating gate electrode extends over active regions of the PMOS access transistor, the PMOS control capacitor and the NMOS programming transistor.

2. The non-volatile memory system of claim 1, wherein each non-volatile memory cell further comprises a gate dielectric layer located between the floating gate electrode and the active regions, wherein the gate dielectric layer comprises silicon oxide having a thickness between 40 and 100 Angstroms.

3. The non-volatile memory system of claim 1, wherein the floating gate electrode comprises one continuous layer extending over all active areas of the non-volatile memory cell.

4. The non-volatile memory system of claim 1, wherein the NMOS programming transistor comprises a three-terminal NMOS capacitor.

5. The non-volatile memory system of claim 1, wherein the one or more non-volatile memory cells are arranged in an array including a plurality of rows and columns, the non-volatile memory system further comprising:
an n-type region bias line connecting the second n-type region of each PMOS control capacitor in a column of non-volatile memory cells;
a first bit line connecting a source node of each PMOS access transistor in the column of non-volatile memory cells;
a second bit line connecting a drain node of each PMOS access transistor in the column of non-volatile memory cells;
a programming line connecting to a source node and a drain node of each NMOS program transistor in the column of non-volatile memory cells; and
a word line connecting a diffusion electrode of each PMOS control capacitor in a row of non-volatile memory cells,
wherein the n-type region bias line, first bit line, second bit line and programming line extend in parallel in a first direction, and the word line extends in a second direction, not in parallel with the first direction.

6. The non-volatile memory system of claim 5, further comprising an access circuit configured to apply bias voltages to the array, thereby enabling programming to random bits of the array, and enabling erasing of random bits of the array.

7. The non-volatile memory system of claim 5, further comprising an access circuit configured to apply bias voltages to the array, thereby enabling programming to random bits of the array, and enabling simultaneous erasing of a sector of the non-volatile memory cells of the array.

8. The non-volatile memory system of claim 5, further comprising an access circuit configured to apply bias voltages to the array, thereby enabling erasing of random bits of the array, and enabling simultaneous programming to a sector of the non-volatile memory cells of the array.

9. The non-volatile memory system of claim 1, wherein the one or more non-volatile memory cells are arranged in an array including a plurality of rows and columns, the non-volatile memory system further comprising:
an n-type region bias line connecting the second n-type region of each PMOS control capacitor in a row of non-volatile memory cells;
a first bit line connecting a drain node of each PMOS access transistor in the row of non-volatile memory cells;
a word line connecting a diffusion electrode of each PMOS control capacitor in the row of non-volatile memory cells;
a second bit line connecting a source node of each PMOS access transistor in a column of non-volatile memory cells; and
a programming line connecting to a source node and a drain node of each NMOS program transistor in the column of non-volatile memory cells;
wherein the n-type region bias line, the first bit line and the word line extend in parallel in a first direction, and the second bit line and the programming line extend in a second direction, not in parallel with the first direction.

10. The non-volatile memory system of claim 9, further comprising an access circuit configured to apply bias voltages to the array, thereby enabling programming to random bits of the array, and enabling simultaneous erasing of a sector of the non-volatile memory cells of the array.

11. The non-volatile memory system of claim 1, wherein the one or more non-volatile memory cells are arranged in an array including a plurality of rows and columns, the non-volatile memory system further comprising:
an n-type region bias line connecting the second n-type region of each PMOS control capacitor in a column of non-volatile memory cells;
a first bit line connecting a source node of each PMOS access transistor in the column of non-volatile memory cells;
a second bit line connecting a drain node of each PMOS access transistor in the column of non-volatile memory cells;
a programming line connecting to a source node and a drain node of each NMOS program transistor in a row of non-volatile memory cells; and
a word line connecting a diffusion electrode of each PMOS control capacitor in the row of non-volatile memory cells,
wherein the n-type region bias line, the first bit line and the second bit line extend in parallel in a first direction, and the word line and the programming line extend in a second direction, not in parallel with the first direction.

12. The non-volatile memory system of claim 11, further comprising an access circuit configured to apply bias voltages to the array, thereby enabling erasing of random bits of the array, and enabling simultaneous programming to a sector of the non-volatile memory cells of the array.

13. A non-volatile memory system including one or more non-volatile memory cells fabricated on a semiconductor substrate, wherein each non-volatile memory cell comprises:
a floating gate electrode;
an NMOS access transistor located in a p-type region of the substrate, wherein the NMOS access transistor is configured to add negative charge to the floating gate electrode by Fowler-Nordheim tunneling during a program operation, and is further configured to supply current to be sensed during a read operation;
a PMOS erase transistor located in a first n-type region of the substrate, wherein the PMOS erase transistor is configured to remove negative charge from the floating gate electrode by Fowler-Nordheim tunneling during an erase operation; and
a PMOS control capacitor located in a second n-type region of the substrate, which is separate from the first n-type region of the substrate, wherein the floating gate electrode extends over active regions of the NMOS access transistor, the PMOS erase transistor and the PMOS control capacitor.

14. The non-volatile memory system of claim 13, wherein the floating gate electrode comprises one continuous layer extending over all active areas of the non-volatile memory cell.

15. The non-volatile memory system of claim 13, wherein the one or more non-volatile memory cells are arranged in an array including a plurality of rows and columns, the non-volatile memory system further comprising:
- an n-type region bias line connecting the second n-type region of each PMOS control capacitor in a column of non-volatile memory cells;
- a first bit line connecting a source node of each NMOS access transistor in the column of non-volatile memory cells;
- a second bit line connecting a drain node of each NMOS access transistor in the column of non-volatile memory cells; and
- an erase line connecting to a source node and a drain node of each PMOS erase transistor in the column of non-volatile memory cells; and
- a word line connecting a diffusion electrode of each PMOS control capacitor in a row of non-volatile memory cells,
- wherein the n-type region bias line, the first bit line, the second bit line and the erase line extend in parallel in a first direction, and the word line extends in a second direction, not in parallel with the first direction.

16. The non-volatile memory system of claim 15, further comprising an access circuit configured to apply bias voltages to the array, thereby enabling programming to random bits of the array, and enabling erasing of random bits of the array.

17. The non-volatile memory system of claim 15, further comprising an access circuit configured to apply bias voltages to the array, thereby enabling programming to random bits of the array, and enabling simultaneous erasing of a sector of the non-volatile memory cells of the array.

18. The non-volatile memory system of claim 15, further comprising an access circuit configured to apply bias voltages to the array, thereby enabling erasing of random bits of the array, and enabling simultaneous programming to a sector of the non-volatile memory cells of the array.

19. The non-volatile memory system of claim 13, wherein the one or more non-volatile memory cells are arranged in an array including a plurality of rows and columns, the non-volatile memory system further comprising:
- an n-type region bias line connecting the second n-type region of each PMOS control capacitor in a row of non-volatile memory cells;
- a first bit line connecting a drain node of each NMOS access transistor in the row of non-volatile memory cells;
- a word line connecting a diffusion electrode of each PMOS control capacitor in the row of non-volatile memory cells;
- a second bit line connecting a source node of each NMOS access transistor in a column of non-volatile memory cells; and
- an erase line connecting to a source node and a drain node of each PMOS erase transistor in the column of non-volatile memory cells;
- wherein the n-type region bias line, the first bit line and the word line extend in parallel in a first direction, and the second bit line and the erase line extend in a second direction, not in parallel with the first direction.

20. The non-volatile memory system of claim 19, further comprising an access circuit configured to apply bias voltages to the array, thereby enabling erasing of random bits of the array, and enabling simultaneous programming of a sector of the non-volatile memory cells of the array.

21. The non-volatile memory system of claim 13, wherein the one or more non-volatile memory cells are arranged in an array including a plurality of rows and columns, the non-volatile memory system further comprising:
- a first bit line connecting a source node of each NMOS access transistor in a column of non-volatile memory cells;
- a second bit line connecting a drain node of each NMOS access transistor in the column of non-volatile memory cells;
- an n-type region bias line connecting the second n-type region of each PMOS control capacitor in a row of non-volatile memory cells;
- an erase line connecting to a source node and a drain node of each PMOS erase transistor in the row of non-volatile memory cells; and
- a word line connecting a diffusion electrode of each PMOS control capacitor in the row of non-volatile memory cells,
- wherein the first bit line and the second bit line extend in parallel in a first direction, and the n-type region bias line, the erase line and the word line extend in a second direction, not in parallel with the first direction.

22. The non-volatile memory system of claim 21, further comprising an access circuit configured to apply bias voltages to the array, thereby enabling programming of random bits of the array, and enabling simultaneous erasing of a sector of the non-volatile memory cells of the array.

* * * * *